United States Patent [19]
Imamiya

[11] Patent Number: 5,834,968
[45] Date of Patent: Nov. 10, 1998

[54] LOW PASS FILTER

[75] Inventor: Keniti Imamiya, Kawasaki, Japan

[73] Assignee: Kabushiki Kaisha Toshiba, Japan

[21] Appl. No.: 720,580

[22] Filed: Oct. 2, 1996

[30] Foreign Application Priority Data

Oct. 2, 1995 [JP] Japan ...................................... 7-254781

[51] Int. Cl.$^6$ ................................ H03K 5/00; H03K 1/10
[52] U.S. Cl. ........................... 327/552; 327/558; 327/34; 327/37; 327/165; 327/166; 327/79; 327/90
[58] Field of Search ..................................... 327/551, 552, 327/555, 556, 557, 558, 559, 256, 201, 199, 311, 34, 37, 38, 165, 166, 167; 333/172, 173

[56] References Cited

U.S. PATENT DOCUMENTS 4,137,504  1/1979  Simmons ................................. 327/552

*Primary Examiner*—Timothy P. Callahan
*Assistant Examiner*—Dinh Le
*Attorney, Agent, or Firm*—Banner & Witcoff

[57] ABSTRACT

A low pass filter comprises a complementary signal generator circuit for receiving an input pulse signal to output a first and a second signals having phases inverse to each other, a first CR circuit inputted with the first signal, a second CR circuit inputted with the second signal, a flip-flop circuit, a set circuit, and a reset circuit. In the low pass filter, the set circuit detects an output signal of the first CR circuit by the threshold voltage value thereof to set the flip-flop circuit in accordance with a detection result, and the reset circuit detects an output signal of the second CR circuit by the same threshold voltage value to reset the flip-flop circuit in accordance with a detection result.

6 Claims, 6 Drawing Sheets

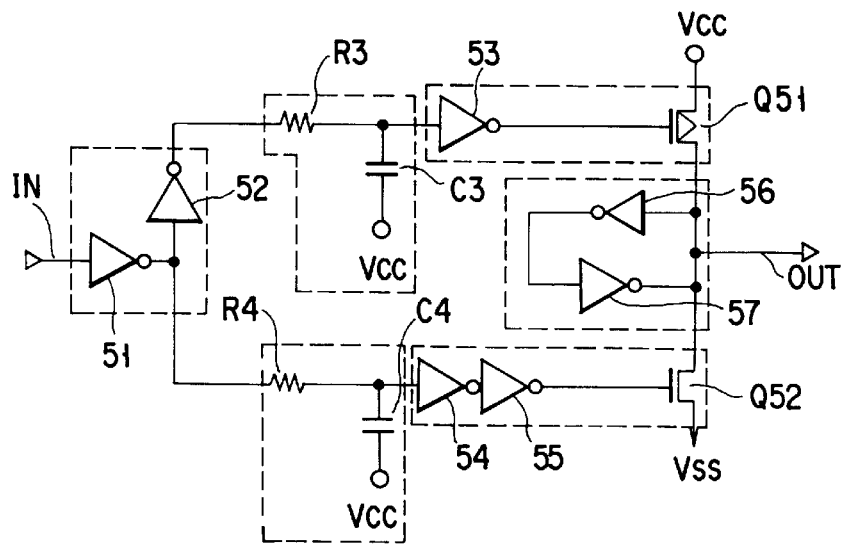
F I G. 5A
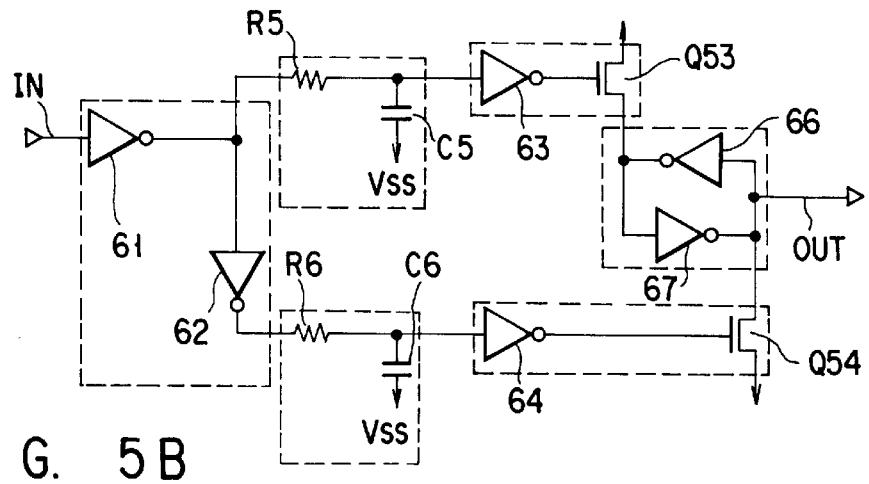
F I G. 5B
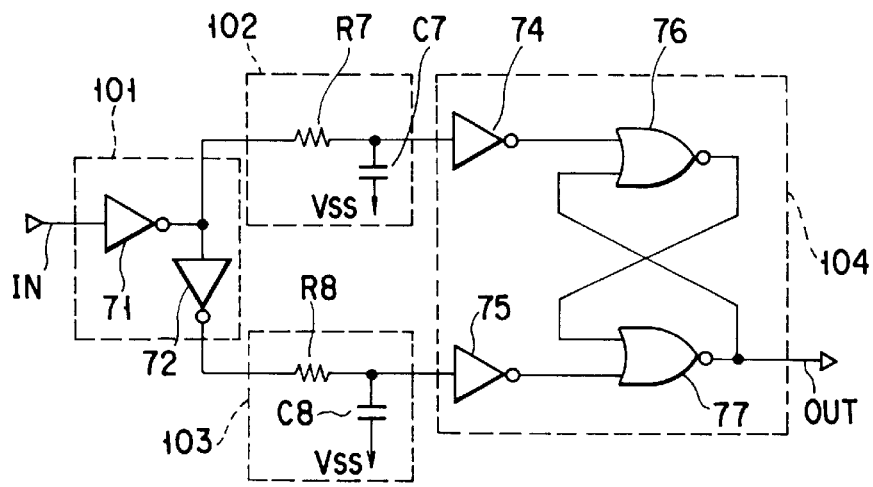
F I G. 6A

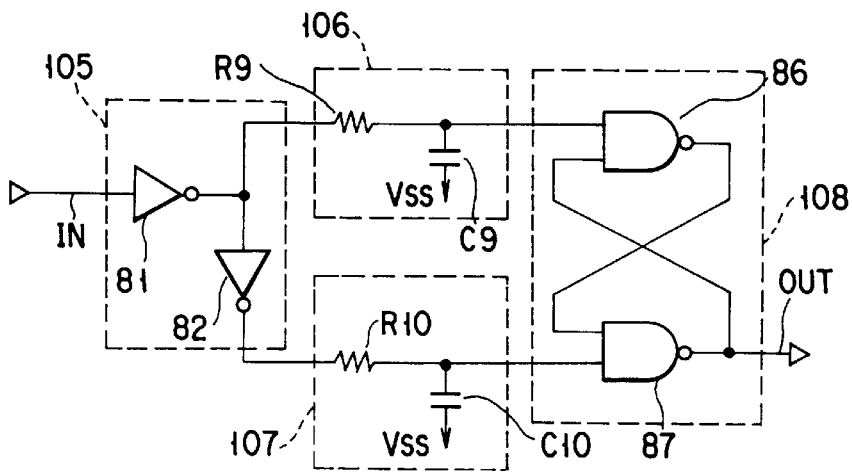
F I G. 6B

LOW PASS FILTER

BACKGROUND OF THE INVENTION

1. Field of the Invention

The present invention relates to a low pass filter for a logic circuit used in a semiconductor circuit.

2. Description of the Related Art

The structure of a conventional low pass filter is shown in FIG. 7. Inverter circuits 21 and 22 are connected in series with each other, and the output terminal thereof is connected to a CR circuit 23. Further, the output terminal of the CR circuit 23 is connected to inverter circuits 24 and 25 in series with each other. According to the structure thus constructed, an input signal supplied to a terminal IN is delayed and then supplied as an output signal to a terminal OUT.

The operation of the circuit shown in FIG. 7 is shown in FIG. 8. When an input signal rises from a Vss potential to a Vcc potential, i.e., from a low logic level (a "L" level) to a high logic level (a "H" level) at the time point t70, the potential of the terminal h gradually changes from the "L" level toward the "H" level. Further, when the potential of the terminal h excesses the circuit threshold voltage value Vth of the inverter 24 (Vth=2.5V=½·Vcc, Vss=0V, Vcc 5V), at the time point t71, the output signal from the OUT terminal changes from the "L" level to the "H" level. Subsequently, when the input signal falls from the "L" level to the "H" level at the time point t72, the potential of the terminal h gradually changes toward the "L" level. Further, when the potential decreases to be lower than the circuit threshold voltage value Vth of the inverter 24 at the time point t73, the output signal at the OUT terminal changes from the "H" level to the "L" level. In this manner, a delayed signal is outputted through the output terminal. Thus, the circuit of FIG. 7 operates as a delay circuit.

Subsequently, when the input signal IN rises from the "L" level to the "H" level at the time point t74, the potential of the terminal h gradually changes from the "L" level toward the "H" level. However, when the pulse width of the input pulse is small and the input signal falls from the "H" level to the "L" level while the input signal does not exceed the circuit threshold voltage value Vth value of the inverter 24, the potential of the terminal h gradually changes toward the "L" level. As has been described above, when the pulse width of the input pulse is smaller than a certain width, the pulse is not transferred to the output terminal. Therefore, the circuit of FIG. 7 operates as a low pass filter.

In the next, a problem of the circuit FIG. 7 will be explained. The problem is that the minimum pulse width of an input pulse transmitted to the output terminal varies, depending on whether the input pulse is a "H" level pulse or a "L" level pulse. This problem is caused when the circuit threshold voltage value of the inverter circuit 24 is not strictly ½·Vcc but changes on variation in the manufacturing process. FIG. 9A shows signal charts in a case where an input pulse is a "H" level pulse of a predetermined pulse width and FIG. 9B shows signal charts in a case where an input pulse is a "L" level pulse of the same pulse width. In these cases, it is supposed that the threshold voltage value of the inverter circuit 24 is slightly higher than a value to be set.

At first, assume that a "H" level pulse is inputted as shown in FIG. 9A. When the input signal rises from the "L" level to the "H" level at the time point t80, the potential of the terminal h gradually changes from the "L" level toward the "H" level. However, since the circuit threshold voltage value Vth of the inverter 24 is a potential slightly higher than the value to be set, the potential of the terminal h gradually changes toward the "L" level, if the input signal falls from the "H" level to "L" level at the time point t81 without exceeding the circuit threshold voltage value Vth. Thus, the input pulse is not transferred to the output terminal.

Meanwhile, discussion will be made to a case where the "L" level pulse having a pulse width equal to that of the "H" level pulse is inputted. When the input signal falls from the "H" level to the "L" level at the time point t82, the potential of the terminal h gradually changes from the "H" level toward the "L" level. Further, when the potential decreases to be lower than the circuit threshold voltage value Vth of the inverter circuit 24, the output signal at the OUT terminal changes from the "H" level to the "L" level. Subsequently, when the input signal rises from the "L" level to the "H" level at the time point t84, the potential gradually changes toward the "H" level. Further, when the input signal exceeds the circuit threshold voltage value Vth of the inverter 24, the output signal at the OUT terminal changes from the "L" level to the "H" level. In the manner as described above, the input pulse is transferred to the output terminal. As will be understood, regardless of the pulse width of the "L" level input pulse being equal to that of the "H" level input pulse, the "L" level input pulse is transferred to the output terminal, when the threshold voltage value increases to be higher than the value to be set.

Thus, the first disadvantage of the conventional low pass filter lies in that the minimum pulse width of an input pulse which can be transmitted varies, depending on whether the input pulse is a "H" level pulse or a "L" level pulse. In addition, even in case where an output pulse is obtained, the pulse width of the output pulse varies between a "H" level input pulse and a "L" level input pulse, regardless of the pulse widths of the input pulses having the same pulse width.

Subsequently, the second disadvantage of the circuit shown in FIG. 7 will be explained next. This problem is that the pulse width of the input pulse differs from the pulse width of the output pulse even when the input pulse has a relatively large pulse width. FIG. 10 shows a case in which the input pulse is a "H" level pulse. The threshold voltage value of the inverter circuit 24 is assumed to be slightly higher than the value to be set.

When the input pulse signal rises from the "L" level to the "H" level at the time point t90, the potential of the terminal h gradually changes from the "L" level toward the "H" level. Further, when the potential exceeds the circuit threshold voltage value Vth of the inverter 24 at the time point t91, the output signal at the OUT terminal changes from the "L" level to the "H" level. Subsequently, when the input signal falls from the "H" level to the "L" level at the time point 92, the potential of the terminal h gradually changes toward the "L" level. Further, when the input signal decreases to be lower than the circuit threshold voltage value of the inverter 24, the output signal at the OUT terminal changes from the "H" level to the "L" level. In this manner, an input pulse signal is transferred to the output terminal. However, as shown in FIG. 10, it is understood that the width of the output pulse differs from the width of the input pulse, more specifically, the width of the output pulse is smaller than the width of the input pulse. This is the second problem of the conventional low pass filter.

Further, even if the threshold voltage value can be controlled to be substantially equal to a value to be set, the resistance value and the capacitor value of the CR circuit of the conventional low pass filter must be made slightly large, so that the occupation area of this circuit must be increased on the chip. This is the third disadvantage.

As has been described above, the low pass filter in a conventional logic circuit has several disadvantages. These problems are summarized as follows. That is, when the threshold voltage value shifts from ½·Vcc, the minimum pulse width of a transferred pulse varies depending on whether a "H" level pulse or a "L" level pulse is inputted. In addition, with respect to a transferred pulse, the output pulse width varies depending on whether a "H" level pulse or a "L" level pulse is inputted.

In addition, as for a sufficiently long input pulse, there is a problem that the input pulse width is not equal to the output pulse width. In addition, there is another problem that the occupation area of the circuit is large with respect to the semiconductor chip.

SUMMARY OF THE INVENTION

The present invention has an object of solving the above problems, and an object of providing a low pass filter in which the minimum pulse width of a passable input pulse is equal for a "H" level pulse and a "L" level input pulse. Another object of the present invention is to provide a low pass filter in which a passable pulse has an equal output pulse width for a "H" level input pulse and a "L" level input pulse. A further object of the present invention is to provide a low pass filter in which the input pulse width and the output pulse width are equal to each other for a sufficiently long input pulse.

A still further object of the present invention is to provide a low pass filter which has a relatively small occupation area on the semiconductor chip.

In order to solve the above problems, the present invention provides a low pass filter comprising: an input terminal of the filter; an output terminal of the filter; a complementary signal generator circuit connected to the input terminal of the filter, for outputting a first signal having a phase equal to a signal supplied to the input terminal of the filter, and a second signal having a phase inverse to the signal supplied to the input terminal of the filter; a first CR circuit inputted with the first signal; a second CR circuit inputted with the second signal; a flip-flop circuit connected to the output terminal of the filter; a set circuit connected to an output terminal of the first CR circuit, for detecting an output signal of the first CR circuit by means of a predetermined threshold voltage value, and for setting the flip-flop circuit in accordance with a detection result; and a reset circuit connected to an output terminal of the second CR circuit, for detecting an output signal of the second CR circuit by means of a threshold voltage value equal to the predetermined threshold voltage value, and for resetting the flip-flop circuit in accordance with a detection result. Here, the threshold voltage values of the set circuit and the reset circuit are set to be lower than an intermediate potential between a power source potential and a ground potential. The set circuit and the reset circuit are arranged such that setting operation of the set circuit and resetting operation of the reset circuit are not competitively performed.

More specifically, the low pass filter of the present invention is comprising: an input terminal of the filter; a complementary signal generator circuit connected to the input terminal of the filter, for outputting a first signal to a first terminal, and for outputting a second signal to a second terminal, said first signal having a phase equal to that of a signal supplied to the input terminal of the filter, and said second signal having a phase inverse to that of the signal supplied to the input terminal of the filter; a first CR circuit having an input terminal connected to the first terminal, for outputting a delayed output to a third terminal; a second CR circuit having an input terminal connected to the second terminal, for outputting a delayed output to a fourth terminal; an output terminal of the filter; a flip-flop circuit connected to the output terminal of the filter; a first MOS transistor connected between a terminal of the flip-flop circuit and a terminal supplied with a power source potential; a second MOS transistor connected between the terminal of the flip-flop circuit and a terminal supplied with a ground potential; a first conducting circuit for rendering the first MOS transistor conductive when the third terminal has a potential lower than a predetermined potential; and a second conducting circuit for rendering the second MOS transistor conductive when the fourth terminal has a potential lower than the predetermined potential. The first MOS transistor is a P-type MOS transistor. The first conducting circuit is inverter circuits arranged in an even number of stages. The second MOS transistor is an N-type MOS transistor. The second conducting circuit is at least one inverter circuit arranged in an odd number of stages.

According to another embodiment, there is provided a low pass filter comprising: an input terminal of the filter; a complementary signal generator circuit connected to the input terminal of the filter, for outputting a first signal to a first terminal, and for outputting a second signal to a second terminal, said first signal having a phase inverse to that of a signal supplied to the input terminal of the filter, and said second signal having a phase equal to that of the signal supplied to the input terminal of the filter; a first CR circuit having an input terminal connected to the first terminal, for outputting a delayed output to a third terminal; a second CR circuit having an input terminal connected to the second terminal, for outputting a delayed output to a fourth terminal; an output terminal of the filter; a flip-flop circuit connected to the output terminal of the filter; a first MOS transistor connected between a terminal of the flip-flop circuit and a terminal supplied with a ground potential; a second MOS transistor connected between another terminal of the flip-flop circuit and the terminal supplied with the ground potential; a first conducting circuit for rendering the first MOS transistor conductive when the third terminal has a potential lower than a predetermined potential; and a second conducting circuit for rendering the second MOS transistor conductive when the fourth terminal has a potential lower than the predetermined potential. The first MOS transistor is a P-type MOS transistor. The first conducting circuit is inverter circuits arranged in an even number of stages. The second MOS transistor is an N-type MOS transistor. The second conducting circuit is at least one inverter circuit arranged in an odd number of stages.

According to further another embodiment, there is provided a low pass filter comprising: an input terminal of the filter; a complementary signal generator circuit connected to the input terminal of the filter, for outputting a first signal to a first terminal, and for outputting a second signal to a second terminal, said first signal having a phase equal to that of a signal supplied to the input terminal of the filter, and said second signal having a phase inverse to that of the signal supplied to the input terminal of the filter; a first CR circuit having an input terminal connected to the first terminal, for outputting a delayed output to a third terminal; a second CR circuit having an input terminal connected to the second terminal, for outputting a delayed output to a fourth terminal; an output terminal of the filter; a flip-flop circuit connected to the output terminal of the filter; a first MOS transistor connected between a terminal of the flip-flop circuit and a terminal supplied with a ground potential; a second MOS transistor connected between another terminal of the flip-flop circuit and the terminal supplied with the ground potential; a first conducting circuit for rendering the first MOS transistor conductive when the third terminal has a potential lower than a predetermined potential; and a second conducting circuit for rendering the second MOS transistor conductive when the fourth terminal has a potential lower than the predetermined potential. The first MOS transistor is an N-type MOS transistor. The first conducting circuit is at least one inverter circuit arranged in an odd number of stages. The second MOS transistor is an N-type MOS transistor. The second conducting circuit is at least one inverter circuit arranged in an odd number of stages.

Further, according to the present invention, there is provided a low pass filter comprising: an input terminal of the filter; an output terminal of the filter; a complementary signal generator circuit connected to the input terminal of the filter, for outputting a first signal having a phase equal to a signal supplied to the input terminal of the filter, and a second signal having a phase inverse to the signal supplied to the input terminal of the filter; a first CR circuit inputted with the first signal; a second CR circuit inputted with the second signal; and a flip-flop circuit connected to the output terminal of the filter, set by an output from the first CR circuit and reset by an output from the second CR circuit.

According to the structure constructed as above, it is possible to provide a low pass filter in which the minimum pulse width is equal for a passable "H" level pulse and a passable "L" level pulse, in which a passable "H" level pulse and a passable "L" level pulse have an equal output pulse width, in which the input pulse width is equal to the output pulse width for a sufficiently long input pulse, and in which the occupation area of the filter is relatively small on a chip.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a party of the specification, illustrate presently preferred embodiments of the invention and, together with the general description given above and the detailed description of the preferred embodiments given below, serve to explain the principles of the invention.

FIG. 5A shows a second embodiment of a low pass filter according to the present invention.

FIG. 5B shows a third embodiment of a low pass filter according to the present invention.

FIG. 6A shows a fourth embodiment of a low pass filter according to the present invention.

FIG. 6B shows a fifth embodiment of a low pass filter according to the present invention.

DETAILED DESCRIPTION OF THE PREFERRED EMBODIMENTS

Next, preferred embodiments of the present invention will be explained with reference to the drawings.

Figure 1:
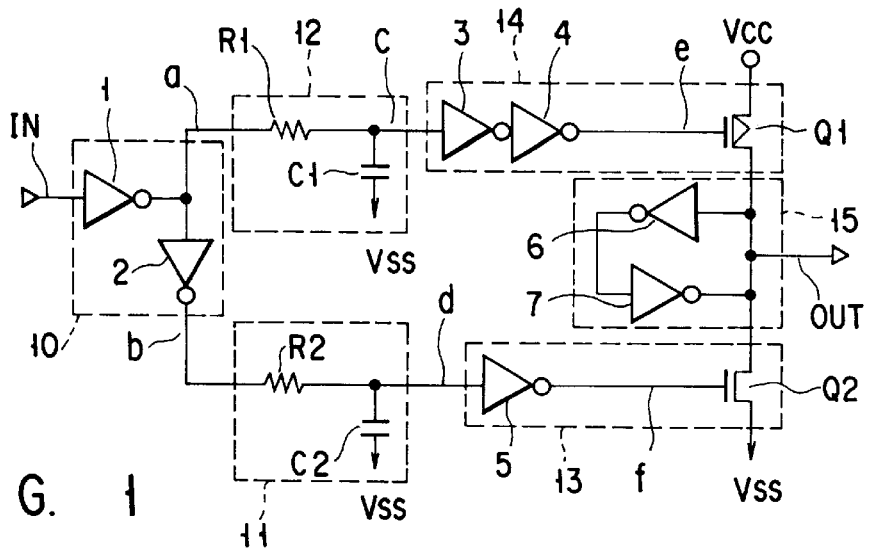
FIG. 1 is a circuit diagram of a low pass filter according to a first embodiment of the present invention.

FIG. 1 shows an embodiment of the present invention. As shown in FIG. 1, the low pass filter of the present invention comprises an input terminal IN, an output terminal OUT, a complementary signal generator circuit 10, CR circuits 11 and 12, a set circuit 14, a reset circuit 13, and a flip-flop circuit 15.

The complementary signal generator circuit 10 is connected to the input terminal IN. The signal generator circuit 10 outputs a signal having a phase equal to that of the signal supplied to the input terminal and a signal having a phase reversal thereto. This circuit comprises inverter circuits 1 and 2 connected in series with each other.

The CR circuit 12 comprises a resistors R1 and a capacitor element C1, thus forming a CR integration circuit. Likewise, the CR circuit 11 comprises a resistor R2 and a capacitor element C2, thus forming a CR integration circuit. The input terminal of the CR circuit 11 is connected to the output terminal of the inverter circuit 2 of the complementary signal generator circuit 10, and the input terminal of the CR circuit 12 is connected to the output terminal of the inverter circuit 1.

The flip-flop circuit 15 is connected to the output terminal OUT, and comprises inverter circuits 6 and 7 connected in inversely parallel with each other.

The set circuit 14 is connected to the output terminal of the CR circuit 12, and detects an output signal from the CR circuit 12, by a predetermined threshold voltage value Vth of the set circuit 14. The set circuit 14 sets the flip-flop circuit 15 in accordance with the detection result. This circuit 14 comprises a P-type MOS transistor Q1 and inverter circuits 3 and 4 of an even number of stages (e.g., two stages as in this embodiment). The P-type MOS transistor Q1 is connected between a terminal applied with a power source potential Vcc and an output side terminal of the flip-flop circuit. The inverter circuits 3 and 4 of an even number of stages are connected in series between the output terminal of the CR circuit 12 and the gate of the P-type MOS transistor Q1.

The reset circuit 13 is connected to the output terminal of the CR circuit 11, and detects the output signal of the CR circuit 11, by a threshold voltage value Vth equal to the threshold voltage value Vth of the set circuit 14. The reset circuit 13 resets the flip-flop circuit in accordance with the detection result. This circuit 13 comprises an N-type MOS transistor Q2 and an inverter circuit 5 arranged in an odd number of stages (e.g., one stage as in this embodiment). The N-type MOS transistor Q2 is connected between the terminal applied with a ground potential Vss and the output side terminal of the flip-flop circuit. The inverter circuit 5 of an odd number of stages is connected in series between the output terminal of the CR circuit 11 and the gate of the N-type MOS transistor Q2.

In the low pass filter constructed in the above structure, in order to prevent the MOS transistors Q2 and Q1 from being simultaneously rendered conductive (i.e., in order to prevent occurrence of competition between the setting operation and the reset operation), the threshold voltage value Vth of the inverter circuits 3 and 5 in the first stages of the set circuit 14 and the reset circuit 13 is set to be lower than an intermediate potential between the power source potential Vcc and the ground potential Vss.

In the following, the operation of the circuit shown in FIG. 1 will be explained.

Figure 2:
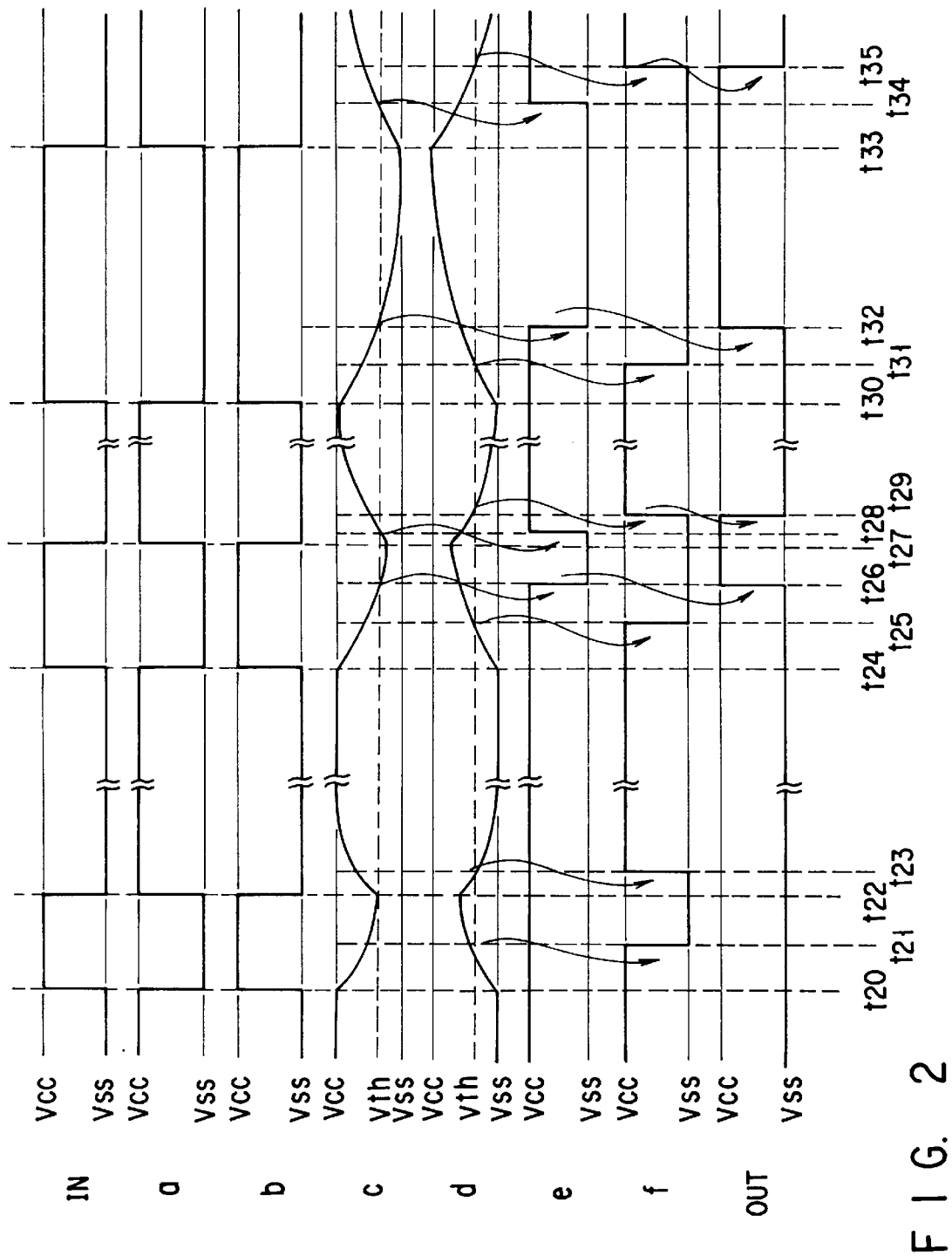
FIG. 2 is a signal chart showing operation waveforms of a low pass filter according to the embodiment of FIG. 1 of the present invention.

FIG. 2 shows potentials of respective nodes when three types of the "H" level pulses having pulse widths different from each other are inputted.

The input signal IN rises from the "L" level to the "H" level at the time point t20. Accordingly, the potential of the node a changes from the "H" level to the "L" level, and the potential of the node b changes from the "L" level to the "H" level. In addition, the potential of the node c gradually changes from the "H" level toward the "L" level, and the potential of the node of gradually changes from the "L" level toward the "H" level. When the potential of the node d exceeds the threshold voltage value Vth of the inverter 3 and 5, the potential of the node f changes from the "H" level to the "L" level. Subsequently, at the time point t22, the input signal IN falls from the "H" level to the "L" level. Accordingly, the potential of the node a changes from the "L" level to the "H" level, and the potential of the node b changes from the "H" level to the "L" level. In addition, the potential of the node c gradually changes to the "H" level, and the potential of the node d gradually changes to the "L" level. At the time point t23, when the potential of the node d falls to be lower than the threshold voltage value Vth, the potential of the node f changes from the "L" level to the "H" level.

Subsequently, at the time point t24, the input signal IN rises from the "L" level to the "H" level. Accordingly, the potential of the node a changes from the "H" level to the "L" level, and the potential of the node b changes from the "L" level to the "H" level. In addition, the potential of the node c gradually changes from the "H" level toward the "L" level, and the potential of the node d gradually changes from the "L" level toward the "H" level. Subsequently, at the time point t25, when the potential of the node d exceeds the threshold voltage value Vth, the potential of the node f changes from the "H" level to the "L" level. Subsequently, at the time point t26, when the potential of the node c decreases to be lower than the threshold voltage value Vth, the potential of the node e changes from the "H" level to the "L" level. As a result of this, the MOS transistor Q1 is turned on, the flip-flop circuit 15 is inverted, and the output signal OUT changes from the "L" level to the "H" level. Subsequently, at the time point t27, the input signal IN falls from the "H" level to the "L" level. Accordingly, the potential of the node a changes from the "L" level to the "H" level, and the potential of the node b changes from the "H" level to the "L" level. In addition, the potential of the node c gradually changes to the "H" level, and the potential of the node d gradually changes to the "L" level. At the time point t28, when the potential of the node c exceeds the threshold voltage value Vth, the potential of the node e changes from the "L" level to the "H" level. At the time point t29, when the potential of the node d decreases to be lower than the threshold voltage value Vth, the potential of the node f changes from the "L" level to the "H" level. As a result of this, the MOS transistor Q2 is turned on, the flip-flop circuit 15 is inverted, and the output signal OUT changes from the "H" level to the "L" level.

Subsequently, at the time point t30, the input signal IN rises from the "L" level to the "H" level. Accordingly, the potential of the node a changes from the "H" level to the "L" level, and the potential of the node b changes from the "L" level to the "H" level. In addition, the potential of the node c gradually changes from the "H" level to the "L" level, and the potential of the node d changes from the "L" level to the "H" level. At the time point t31, when the potential of the node d exceeds the threshold voltage value Vth, the potential of the node f changes from the "H" level to the "L" level. Subsequently, at the time point t32, when the potential of the node c decreases to be lower than the threshold voltage value Vth, the potential of the node e changes from the "H" level to the "L" level. In this manner, the MOS transistor Q1 is turned on, the flip-flop circuit 15 is inverted, and the output signal OUT changes from the "L" level to the "H" level. Subsequently, at the time point t33, the input signal IN falls from the "H" level to the "L" level. Accordingly, the potential of the node a changes from the "L" level to the "H" level, and the potential of the node b changes from the "H" level to the "L" level. In addition, the potential of the node c gradually changes to the "H" level, and the potential of the node d gradually changes to the "L" level. At the time point t34, when the potential of the node c exceeds the threshold voltage value Vth, the potential of the node e changes from the "L" level to the "H" level. At the time point t35, when the potential of the node d decreases to be lower than the threshold voltage value Vth, the potential of the node f changes from the "L" level to the "H" level. In this manner, the MOS transistor Q2 is turned on, the flip-flop circuit 15 is inverted, and the output signal OUT changes from the "H" level to the "L" level.

As has been explained above, in the circuit of FIG. 1, two CR circuits 11 and 12 are simultaneously operated, and the flip-flop circuit 15 is inverted by one of the outputs c and d of the circuits 11 and 12, which crosses the threshold voltage value Vth later than the other output. Specifically, when the input signal changes from the "L" level to the "H" level, the flip-flop circuit 15 is inverted by the output c of the CR circuit 12. On the other hand, when the input signal changes from the "H" level to the "L" level, the flip-flop circuit 15 is inverted by the output d of the CR circuit 11. At any rate, as can be easily understood from FIG. 2, the circuit of FIG. 1 does not allow a pulse having a pulse width smaller than a predetermined pulse width (e.g., the first pulse of the input signal IN of FIG. 1) to pass, thus operating as a low pass filter.

In the next, explanation will be made to the fact that passing pulses have an equal pulse width, for both of the "H" level and the "L" level pulses, using FIG. 3.

At first, the case where an "H" level pulse is inputted will be explained. At the time point t40, the input signal IN rises from the "L" level to the "H" level. Accordingly, the potential of the node a changes from the "H" level to the "L" level, and the potential of the node b changes from the "L" level to the "H" level. In addition, the potential of the node c gradually changes from the "H" level to the "L" level, and the potential of the node d gradually changes from the "L" level toward the "H" level. Subsequently, at the time point t41, when the potential of the node d exceeds the threshold voltage value Vth, the potential of the node f changes from the "H" level to the "L" level. Subsequently, at the time point t42, the potential of the node c decreases to be lower than the threshold voltage value Vth, the potential of the node e changes from the "H" level to the "L" level. As a result of this, the MOS transistor Q1 is turned on, the flip-flop circuit 15 is inverted, and the output signal OUT changes from the "L" level to the "H" level. Subsequently, at the time point t43, the input signal IN falls from the "H" level to the "L" level. Accordingly, the potential of the node a changes from the "L" level to the "H" level, and the potential of the node b changes from the "H" level to the "L" level. In addition, the potential of the node c gradually changes to the "H" level, and the potential of the node d gradually changes to "L". At the time point t44, when the potential of the node c exceeds the threshold voltage value Vth, the potential of the node e changes from the "L" level to the "H" level. Subsequently, at the time point t45, when the potential of the node d decreases to be lower than the threshold voltage value Vth, the potential of the node f changes from the "L" level to the "H" level. In this manner, the MOS transistor Q2 is turned on, the flip-flop circuit 15 is inverted, and the output signal OUT changes from the "H" level to the "L" level.

In the next, explanation will be made to a case where a "L" level pulse is inputted. At the time point t46, the input signal IN falls from the "H" level to the "L" level. Accordingly, the potential of the node a changes from the "L" level to the "H" level, and the potential of the node b changes from the "H" level to the "L" level. In addition, the potential of the node c gradually changes from the "L" level to the "H" level, and the potential of the node d gradually changes from the "H" level toward the "L" level. At the time point t47, when the potential of the node c exceeds the threshold voltage value Vth, the potential of the node e changes from the "L" level to the "H" level. Subsequently, at the time point t48, the potential of the node d decreases to be lower than the threshold voltage value Vth, the potential of the node f changes from the "L" level to the "H" level. As a result of this, the MOS transistor Q2 is turned on, the flip-flop circuit 15 is inverted, and the output signal OUT changes from the "H" level to the "L" level. Here, attention should be paid to the fact that the time distance from the time point t46 to the time point t48 is equal to the time distance from the time point t40 to t42. Subsequently, at the time point t49, the input signal rises from the "L" level to the "H" level. Accordingly, the potential of the node a changes from the "H" level to the "L" level, and the potential of the node b changes from the "L" level to the "H" level. In addition, the potential of the node c gradually changes to the "L" level, and the potential of the node d gradually changes to the "H" level. At the time point t50, when the potential of the node c exceeds the threshold voltage value Vth, the potential of the node f changes from the "H" level to the "L" level. Subsequently, at the time point t51, when the potential of the node c decreases to be lower than the threshold voltage value Vth, the potential of the node e changes from the "H" level to the "L" level. In this manner, the MOS transistor Q1 is turned on, the flip-flop circuit 15 is inverted, and the output signal OUT changes from the "L" level to the "H" level. Here, attention should be paid to the fact that the time distance from the time point t49 to t51 is equal to the time distance from the time point t40 to t42, and to the time distance from the time point t46 to the time point t48.

Figure 3:
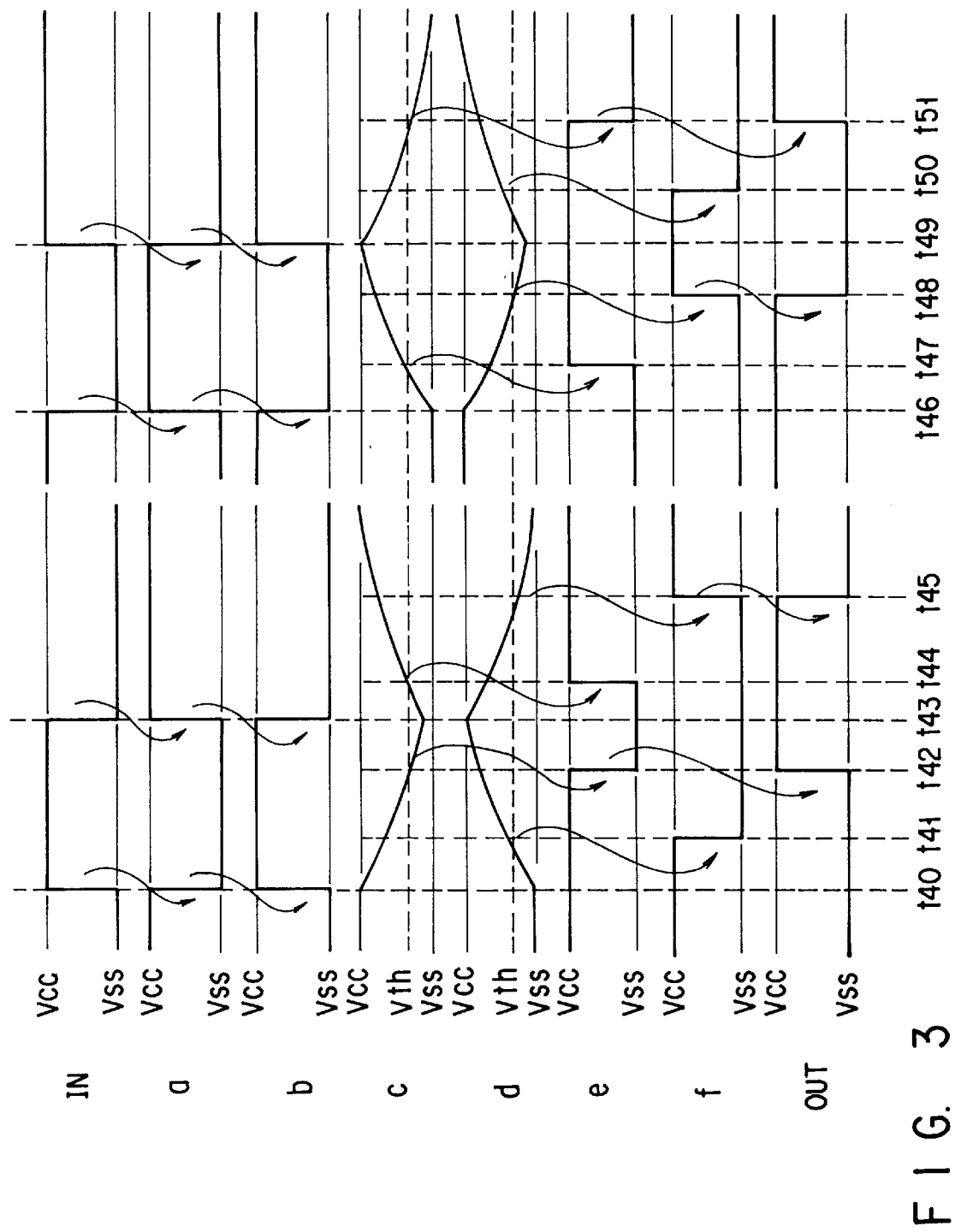
FIG. 3 is a signal chart showing operation waveforms of the low pass filter according to the embodiment of FIG. 1 of the present invention.
Figure 7:
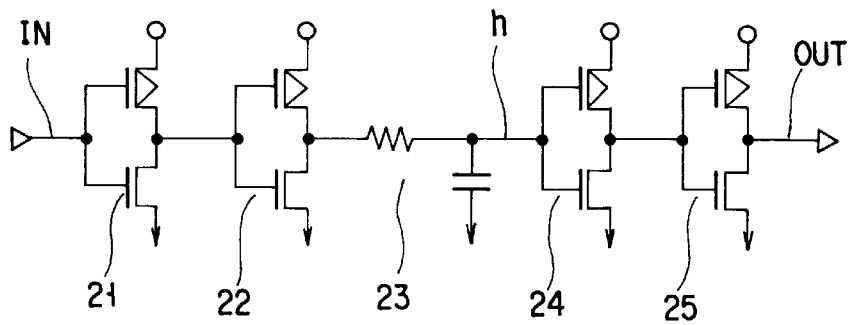
FIG. 7 is a circuit diagram showing a conventional low pass filter.
Figure 8:
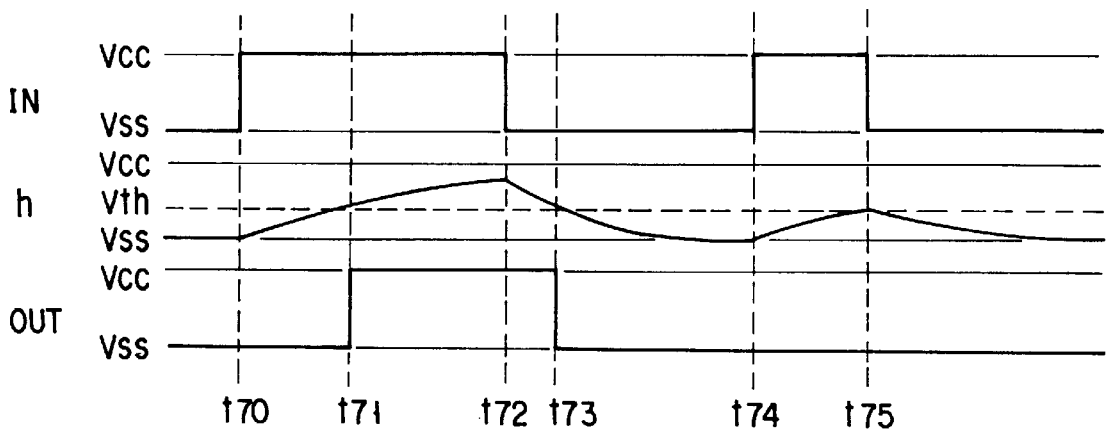
FIG. 8 is a signal chart showing operation waveforms of the conventional low pass filter of FIG. 8.
Figure 9A:
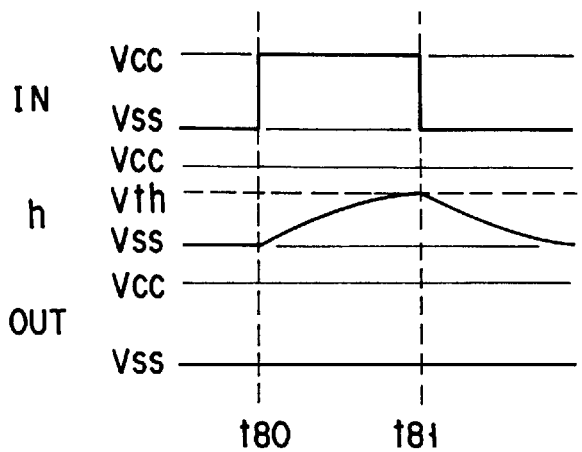
FIG. 9A is a signal chart showing operation waveforms of the conventional low pass filter of FIG. 8.
Figure 9B:
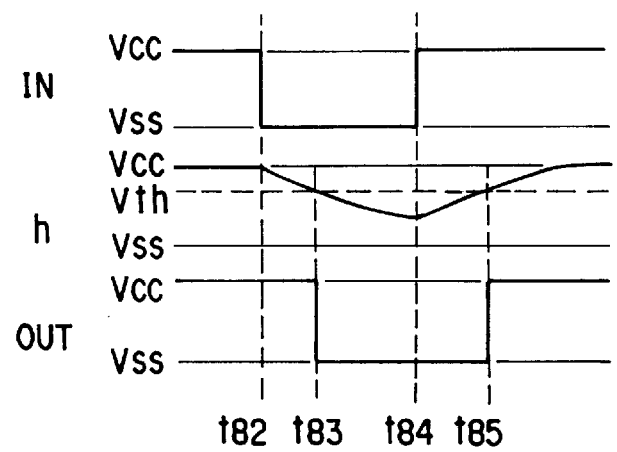
FIG. 9B is a signal chart showing operation waveforms of the conventional low pass filter of FIG. 8.
Figure 10:
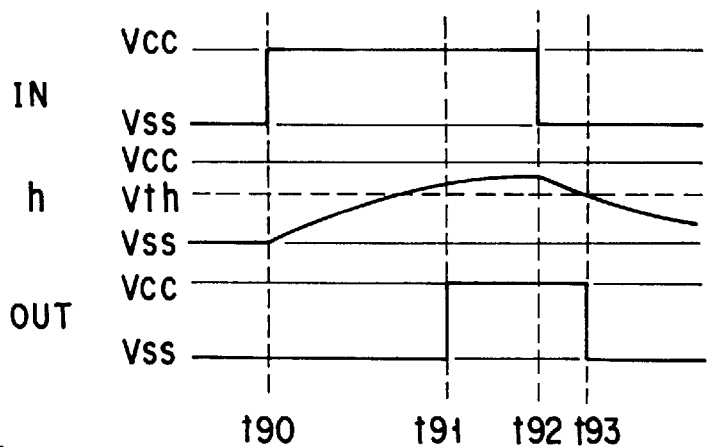
FIG. 10 is a signal chart showing operation waveforms of the conventional low pass filter of FIG. 8.

As is apparent from the above explanation with reference to FIG. 3, according to the present invention, even when the circuit threshold voltage value varies, an equal output pulse width is obtained for the case of a "H" level input pulse and for the case of a "L" level input pulse, as long as the input "H" level pulse and an input "L" level pulse have an equal pulse width. Further, as can be seen from FIG. 3, if the input pulse width is sufficiently long, the input pulse width and the output pulse width thereof are equal to each other even when the circuit threshold voltage value varies. This applies regardless of whether a "H" level pulse or a "L" level pulse is inputted. Further, since Vth can be set within a range of 0<Vth <½·Vcc, the value of Vth need not be strictly equal to ½·Vcc as required in the conventional apparatus.

Note that specific circuit parameters of the circuit shown in FIG. 1 are as follows. The P-type MOS transistor of the inverter circuits 1, 2, and 4 have W/L of 8.0/0.9 (gate width/gate length: in units of $\mu$m), and the N-type MOS transistor has W/L of 4.0/0.8. In the inverter circuits 3 and 5, W/L of the P-type MOS transistor is 4.0/0.9 and the N-type MOS transistor has W/L of 8.0/0.8, in order to arrange the threshold voltage value to be lower than ½·Vcc. W/L of the MOS transistor Q1 is 8.0/0.9 and W/L of the MOS transistor Q2 is 4.0/0.8. Further, in the inverter circuits 6 and 7 forming the flip-flop circuit 15, W/L of the P-type MOS transistor is 4.0/4.0, and W/L of the N-type MOS transistor is also 4.0/4.0, in order that the flip-flop circuit 15 is easily inverted. In addition, the resistance value of each of the resistor elements R1 and R2 is about 12Kohm, and the capacitance value of each of the capacitor elements C1 and C2 is about 1pF. In the structure as arranged above, the threshold voltage value of each of the inverter circuits 3 and 5 is 1.5V with respect to a power source voltage of 5V, and the minimum pulse width of a passable pulse is about 10nm.

By changing the above described parameters, the operation can be adjusted. For example, the circuit threshold voltage value Vth of the inverter circuits 3 and 5 may be set to be low, in order to lengthen the delay time with the input pulse width and the output pulse width being maintained to be equal to each other. This example will be explained with reference to FIG. 4.

Figure 4:
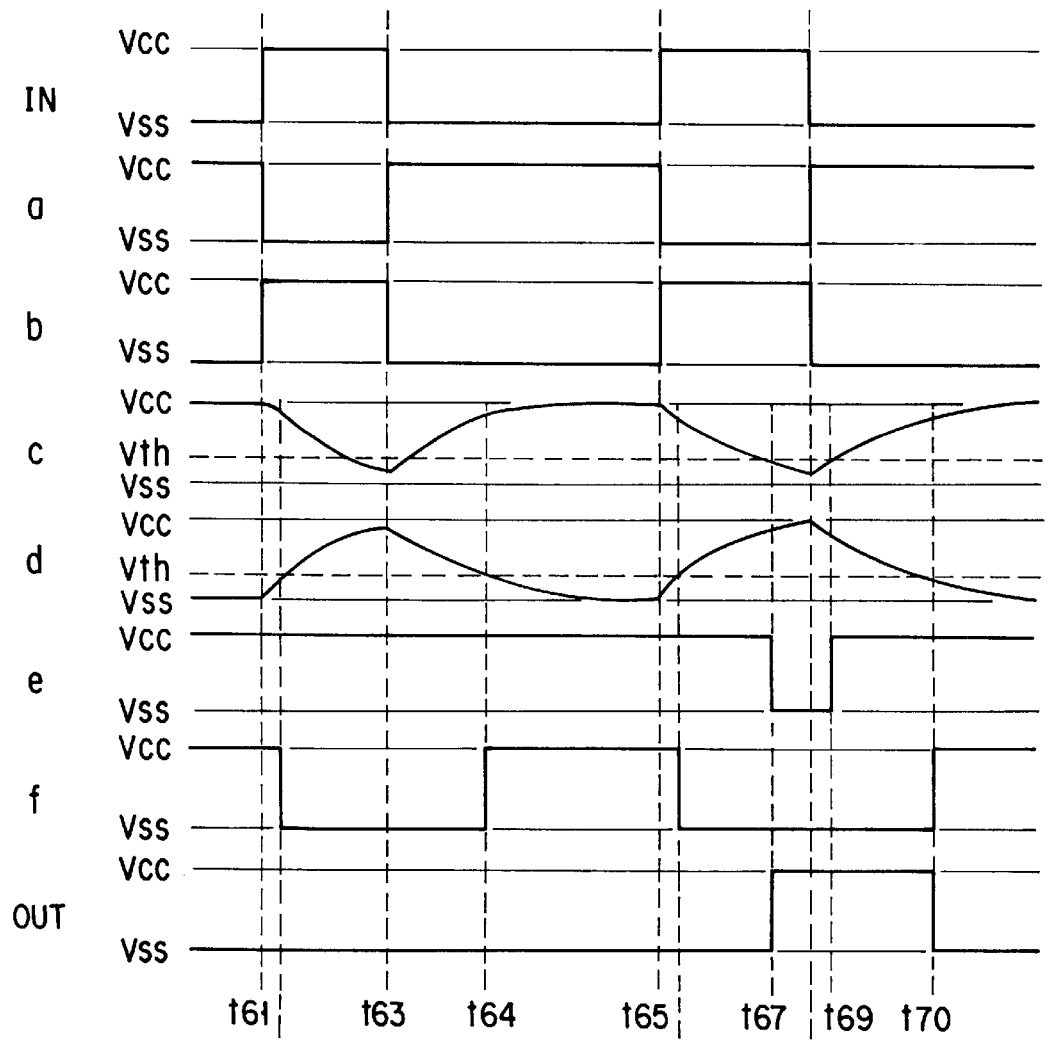
FIG. 4 is a signal chart showing operation waveforms of the low pass filter according to the embodiment of FIG. 1 of the present invention.

At the time point t61, the input signal IN rises from the "L" level to the "H" level. Accordingly, the potential of the node a changes from the "H" level to the "L" level, and the potential of the node b changes from the "L" level to the "H" level. In addition, the potential of the node c gradually changes from the "H" level toward the "L" level, and the potential of the node d gradually changes from the "L" level toward the "H" level. Subsequently, at the time point t62, when the potential of the node d exceeds the threshold voltage value Vth of the inverter 3 and 5, the potential of the node f changes from the "H" level to the "L" level. Subsequently, at the time point t63, the input signal IN falls from the "H" level to the "L" level. Accordingly, the potential of the node a changes from the "L" level to the "H" level, and the potential of the node b changes from the "H" level to the "L" level. In addition, the potential of the node c gradually changes to the "H" level, and the potential of the node d gradually changes to the "L" level. At the time point t64, when the potential of the node d decreases to be lower than the threshold voltage value Vth, the potential of the node f changes from the "L" level to the "H" level. Here, the output pulse is subjected to filtering, as shown in FIG. 4.

Subsequently, at the time point t65, the input signal IN rises from the "L" level to the "H" level. Accordingly, the potential of the node a changes from the "H" level to the "L" level, and the potential of the node b changes from the "L" level to the "H" level. In addition, the potential of the node c gradually changes from the "H" level toward the "L" level, and the potential of the node d gradually changes from the "L" level to the "H" level. At the time point t66, when the potential of the node d exceeds the threshold voltage value Vth, the potential of the node f changes from the "H" level to the "L" level. Subsequently, at the time point t67, when the potential of the node c changes from the "H" level to the "L" level, the potential of the node e changes from the "H" level to the "L" level. As a result of this, the MOS transistor Q1 is turned on, the flip-flop circuit 15 is inverted, and the output signal OUT changes from the "L" level to the "H" level. Subsequently, at the time point t68, the input signal IN falls from the "H" level to the "L" level. Accordingly, the potential of the node a changes from the "L" level to the "H" level, and the potential of the node b changes from the "H" level to the "L" level. In addition, the potential of the node c gradually changes to the "H" level, and the potential of the node d gradually changes to "L" . At the time point t69, when the potential of the node c exceeds the threshold voltage value Vth, the potential of the node e changes from the "L" level to the "H" level. Subsequently, at the time point t76, when the potential of the node d decreases to be lower than the threshold voltage value Vth, the potential of the node f changes from the "L" level to the "H" level. In this manner, the MOS transistor Q2 is turned on, the flip-flop circuit 15 is inverted, and the output signal OUT changes from the "H" level to the "L" level. As can be apparently seen from FIG. 4, since Vth is set to be low, the time required until the potential of the node c falls and crosses the threshold voltage value Vth is lengthened. As a result of this, the time from the rising of the input pulse until the rising of the output pulse is also lengthened. Furthermore, the time required until the potential of the node d falls and crosses the threshold voltage value Vth is also lengthened, and therefore, the time from the fall of the input pulse until the fall of the output pulse is lengthened.

Thus, in the present invention, the delay time is extended longer as the threshold voltage value Vth is lower. On the other hand, if the delay time is maintained constant, the circuit parameters of resistors and capacitor elements may be small values, so that the occupation area of the circuit can be greatly reduced.

With the structure in the above described embodiment of the present invention it is possible to provide a low pass filter in which the minimum pulse width of a passable "H" level pulse is equal to that of a passable "L" level pulse, an equal output pulse width is obtained for the case of an input "H" level pulse and an input "L" level pulse having an equal pulse width, the input pulse width is equal to the output pulse width for a sufficiently long input pulse, and the occupation area on the chip.

In the next, modifications of the present invention will be explained.

FIG. 5A shows a second embodiment of the present invention. This circuit is constructed such that the threshold voltage value Vth of the inverters 53 and 54 is set within a range of ½·Vcc<Vth<Vcc. This circuit comprises inverters 51, 52, 53, 54, 55, 56, and 57, resistor elements R3 and R4, capacitor elements C3 and C4, a P-type MOS transistor Q51, and an N-type MOS transistor Q52. The inverters 51 and 52 constitute a complementary signal generator circuit. The inverter 53 and the P-type MOS transistor Q51 constitute a set circuit, while the inverters 54 and 55 and the N-type MOS transistor Q52 constitute a reset circuit. This circuit operates substantially in the same manner as in the embodiment of FIG. 1. However, in the embodiment of FIG. 1, since the threshold voltage value of the inverters 3 and 5 is set to be low, a P-type MOS transistor and an N-type MOS transistor having a size substantially equal to that of the P-type MOS transistor are connected in series with each other to form each of the inverters 3 and 5, and therefore, the occupation area of the inverters on the chip is restricted to be small. On the other hand, in the circuit of FIG. 5A, the threshold voltage value Vth of the inverters 53 and 54 must be set within a range of ½·Vcc<Vth<Vcc, so that the occupation area of the inverters on the chip is undesirably large in comparison with the circuit of FIG. 1.

FIG. 5B shows a third embodiment of the present invention. The circuit threshold voltage value of the inverters 63 and 64 is arranged within a range of 0<Vth<½·Vcc. The number of circuits used in this embodiment is smaller than those of the embodiments shown in FIG. 1 and FIG. 5A, and an N-type MOS transistor is used as a transistor of the set circuit. As shown in the figure, the circuit configuration of this embodiment comprises inverters 61, 62, 63, 64, 66, and 67, resistor elements R5 and R6, capacitor elements C5 and C6, and N-type MOS transistors Q53 and Q54. The inverters 61 and 62 constitute a complementary signal generator circuit. The inverter 63 and the N-type MOS transistor Q53 constitute a set circuit, and the inverter 64 and the N-type MOS transistor Q54 constitute a reset circuit. In the structure as described above, it is possible to realize a low pass filter which occupies only an extremely small area.

In the next, a fourth embodiment of the present invention will be explained with reference to FIG. 6A. The low pass filter of this embodiment comprises an input terminal IN, an output terminal OUT, a complementary signal generator circuit 101, CR circuits 102, 103, and a flip-flop circuit 104.

The complementary signal generator circuit 101 is connected to the input terminal IN, and outputs a signal having a phase equal to that of the signal supplied to this input terminal and a signal having a phase inverse to the signal supplied to this input terminal.

The CR circuit 102 comprises a resistor R7 and, a capacitor elements C7, thus forming a CR integration circuit. The CR circuit 103 comprises a resistor R8 and a capacitor element C8, thus forming a CR integration circuit.

The flip-flop circuit 104 is connected to an output terminal OUT, and is formed by inverter circuits 74 and 75, and two NOR circuits 76 and 77.

In the low pass filter of this embodiment, the threshold voltage value Vth of the inverters 74 and 75 are set to be lower than an intermediate potential between the power source potential Vcc and the ground potential Vcc.

In the following, a fifth embodiment of the present invention will be explained with reference to FIG. 6B. This low pass filter comprises an input terminal IN, an output terminal OUT, a complementary signal generator circuit 15, CR circuits 106 and 107, and a flip-flop circuit 108.

The complementary signal generator circuit 105 is connected to the input terminal IN, and outputs a signal having a phase equal to that of the signal supplied to this input terminal and a signal having a phase inverse to the signal supplied to this input terminal. This circuit is constituted by inverter circuits 81 and 82.

The CR circuit 106 is constituted by a resistor R9 and a capacitor element C9, while the CR circuit 107 is constituted by a resistor R9 and a capacitor element C10. The CR circuits respectively constitute CR integration circuits.

The flip-flop circuit 108 is connected to the output terminal OUT, and is constituted by two NAND circuits 86 and 87.

In the low pass filter of this embodiment, the threshold voltage value Vth of each of input stage circuits of the NAND circuits 86 and 87 is set to be lower than an intermediate potential between the power source potential Vcc and the ground potential Vcc.

As has been described above, according to the present invention, it is possible to provide a low pass filter in which the minimum pulse width is equal for a passable "H" level pulse and a passable "L" level pulse, in which a passable "H" level pulse and a passable "L" level pulse have an equal output pulse width, in which the input pulse width and the output pulse width have an equal pulse width with respect to a sufficiently long input pulse, and in which the occupation area of the filter on a chip is relatively small.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A low pass filter comprising:
    an input terminal of the filter;
    a complementary signal generator circuit connected to the input terminal of the filter, for outputting a first signal to a first terminal, and for outputting a second signal to a second terminal, said first signal having a phase equal to that of an input signal supplied to the input terminal of the filter, and said second signal having a phase inverse to that of the input signal supplied to the input terminal of the filter;
    a first CR circuit having an input terminal connected to the first terminal, for outputting a first delayed output to a third terminal;
    a second CR circuit having an input terminal connected to the second terminal, for outputting a second delayed output to a fourth terminal;
    an output terminal of the filter;
    a flip-flop circuit connected to the output terminal of the filter;
    a first MOS transistor connected between a terminal of the flip-flop circuit and a terminal supplied with a power source potential;
    a second MOS transistor connected between the terminal of the flip-flop circuit and a terminal supplied with a ground potential;
    a first conducting circuit for rendering the first MOS transistor conductive when the third terminal has a potential lower than a predetermined potential; and
    a second conducting circuit for rendering the second MOS transistor conductive when the fourth terminal has a potential lower than the predetermined potential.

2. A low pass filter according to claim 1, in which the first MOS transistor is a P-type MOS transistor, the first conducting circuit is inverter circuits arranged in an even number of stages, the second MOS transistor is an N-type MOS transistor, and the second conducting circuit is at least one inverter circuit arranged in an odd number of stages.

3. A low pass filter comprising:
    an input terminal of the filter;
    a complementary signal generator circuit connected to the input terminal of the filter, for outputting a first signal to a first terminal, and for outputting a second signal to a second terminal, said first signal having a phase inverse to that of an input signal supplied to the input terminal of the filter, and said second signal having a phase equal to that of the input signal supplied to the input terminal of the filter;
    a first CR circuit having an input terminal connected to the first terminal, for outputting a first delayed output to a third terminal;
    a second CR circuit having an input terminal connected to the second terminal, for outputting a second delayed output to a fourth terminal;
    an output terminal of the filter;
    a flip-flop circuit connected to the output terminal of the filter;
    a first MOS transistor connected between a terminal of the flip-flop circuit and a terminal supplied with a ground potential;
    a second MOS transistor connected between another terminal of the flip-flop circuit and the terminal supplied with the ground potential;
    a first conducting circuit for rendering the first MOS transistor conductive when the third terminal has a potential higher than a predetermined potential; and
    a second conducting circuit for rendering the second MOS transistor conductive when the fourth terminal has a potential higher than the predetermined potential.

4. A low pass filter according to claim 3, in which the first MOS transistor is a P-type MOS transistor, that the a first conducting circuit is inverter circuits arranged in an even number of stages, the second MOS transistor is an N-type MOS transistor, and the a second conducting circuit is at least one inverter circuit arranged in an odd number of stages.

5. A low pass filter comprising:
    an input terminal of the filter;
    a complementary signal generator circuit connected to the input terminal of the filter, for outputting a first signal to a first terminal, and for outputting a second signal to a second terminal, said first signal having a phase equal to that of an input signal supplied to the input terminal of the filter, and said second signal having a phase inverse to that of the input signal supplied to the input terminal of the filter;
    a first CR circuit having an input terminal connected to the first terminal, for outputting a first delayed output to a third terminal;
    a second CR circuit having an input terminal connected to the second terminal, for outputting a second delayed output to a fourth terminal;
    an output terminal of the filter;
    a flip-flop circuit connected to the output terminal of the filter;
    a first MOS transistor connected between a terminal of the flip-flop circuit and a terminal supplied with a ground potential;
    a second MOS transistor connected between another terminal of the flip-flop circuit and the terminal supplied with the ground potential;
    a first conducting circuit for rendering the first MOS transistor conductive when the third terminal has a potential lower than a predetermined potential; and
    a second conducting circuit for rendering the second MOS transistor conductive when the fourth terminal has a potential lower than the predetermined potential.

6. A low pass filter according to claim 5, in which the first MOS transistor is an N-type MOS transistor, the first conducting circuit is at least one inverter circuit arranged in an odd number of stages, the second MOS transistor is an N-type MOS transistor, and the second conducting circuit is at least one inverter circuit arranged in an odd number of stages.

* * * * *